United States Patent
Schwalb

(10) Patent No.: US 11,354,458 B1
(45) Date of Patent: Jun. 7, 2022

(54) AUTOMATED VEHICLE SAFETY SIMULATION USING SAFETY QUOTIENT METHOD

(71) Applicant: MSC.Software Corporation, Newport Beach, CA (US)

(72) Inventor: Edward Schwalb, Irvine, CA (US)

(73) Assignee: Hexagon Manufacturing Intelligence, Inc., Irvine, CA (US)

( * ) Notice: Subject to any disclaimer, the term of this patent is extended or adjusted under 35 U.S.C. 154(b) by 1085 days.

(21) Appl. No.: 15/902,868

(22) Filed: Feb. 22, 2018

(51) Int. Cl.
   *G06F 30/20* (2020.01)
   *G06N 3/08* (2006.01)

(52) U.S. Cl.
   CPC .............. *G06F 30/20* (2020.01); *G06N 3/08* (2013.01)

(58) Field of Classification Search
   CPC .................. G06F 30/20; G06N 3/08
   See application file for complete search history.

(56) References Cited

U.S. PATENT DOCUMENTS

| | | | |
|---|---|---|---|
| 2014/0067252 A1* | 3/2014 | Knoop | B60W 10/184 701/400 |
| 2017/0132334 A1* | 5/2017 | Levinson | G06F 30/20 |
| 2019/0113920 A1* | 4/2019 | England | G05D 1/0257 |
| 2019/0113929 A1* | 4/2019 | Mukadam | B60W 30/085 |
| 2019/0129831 A1* | 5/2019 | Goldberg | G06F 3/04847 |
| 2019/0155291 A1* | 5/2019 | Heit | B60W 30/00 |

OTHER PUBLICATIONS

Matthew O'Kelly, et al., "APEX: Autonomous Vehicle Plan Verification and Execution," SAE World Congress 2016, 1-13 (Year: 2016).*

* cited by examiner

*Primary Examiner* — Steven W Crabb
(74) *Attorney, Agent, or Firm* — Foley & Lardner LLP

(57) ABSTRACT

Examples described herein relate to apparatuses and methods for or simulating and improving performance of an artificial intelligence (AI) driver, including but not limited to determining safety quotients associated with an AI driver and an AI/human driver in simulations to provide data for reinforced machine learning to improve the AI driver.

29 Claims, 5 Drawing Sheets

AUTOMATED VEHICLE SAFETY SIMULATION USING SAFETY QUOTIENT METHOD

CROSS-REFERENCE TO RELATED PATENT APPLICATION

This application is related to U.S. patent application Ser. No. 15/902,894, titled "Automated Vehicle Artificial Intelligence Training Based on Simulations", filed Feb. 22, 2018, which is incorporated herein by reference in its entirety.

BACKGROUND

An automated vehicle (AV) is any self-driving vehicle that is controlled, at least partially, by artificial intelligence (AI). Safety is undoubtedly a major focus for any AV developmental effort. Traditionally, road tests are implemented to test the safety of AI drivers that operate the AVs. However, at least a billion miles of road tests are required to be conducted to obtain sufficient sample size for observing failures, which may be rare. In order to discover particular points of failure, an additional hundreds of millions of miles are required. Furthermore, road tests need to cover a wide range of weather conditions, road conditions, unexpected behaviors of other road occupants (e.g., other cars, cyclists, pedestrians, and the like). In addition, previously performed road tests need to be re-performed after system revisions or updates to confirm that revisions and improvements do not have any unintended side-effects on previously validated aspects of the AI drivers. As such, actual road tests for AVs are impractical to be implemented effectively on a massive scale due to cost and time-consumption. Furthermore, it is not possible to compare performance of an AI driver in a given set of circumstances to performances of other AI drivers or to performances human drivers in the same set of circumstances, because reproducing the same set of circumstances in reality is nearly impossible to achieve.

SUMMARY OF THE INVENTION

Examples described herein related to systems, apparatuses, methods, and non-transitory computer-readable medium for simulating and improving performance of an AI driver by determining a first response from a first computerized simulation that simulates a driving environment based on a first input. The first response includes at least one of a first static temporal clearance parameter, a first dynamic temporal clearance parameter, and a first traffic compliance parameter. The first input being the AI driver. A first safety quotient is determined based on the first response. A second response from a second computerized simulation is determined based on a second input. The second response includes at least one of a second static temporal clearance parameter, a second dynamic temporal clearance parameter, and a second traffic compliance parameter. A second safety quotient is determined based on the second response. A comparison parameter is determined by comparing the first safety quotient and the second safety quotient.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Figure 1:
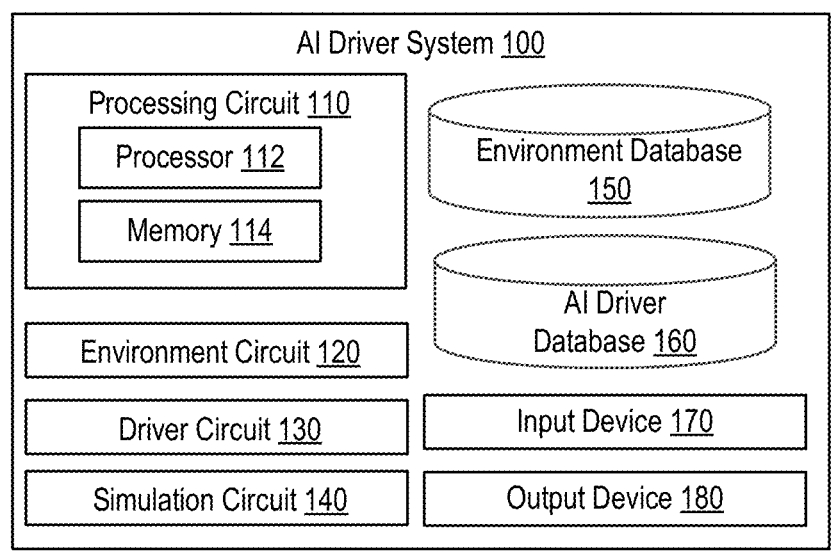
FIG. 1 is a block diagram illustrating an example of a system for simulating and improving performance of an AI driver according to various arrangements.

The detailed description set forth below in connection with the appended drawings is intended as a description of various aspects of the present disclosure and is not intended to represent the only aspects in which the present disclosure can be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure can be practiced without these specific details. In some instances, structures and devices are shown in block diagram form in order to avoid obscuring the concepts of the present disclosure. Acronyms and other descriptive terminology can be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more aspects.

Referring generally to the FIGS., arrangements described herein relate to apparatuses, systems, and methods for performing computerized simulation to improve AI drivers. The computerized simulation provides at-will control over a virtual environment in which behaviors of the AI drivers are simulated, achieves fine-grained decomposition of any particular driving instruction, and produces a wide range of parameters for analysis. A computerized simulation can be executed much more quickly (at least a thousand times faster) than a corresponding actual road test, where the computerized simulation simulates circumstances, conditions, and environmental factors that a physical AV may experience in the actual road test. This is due to the fact that the computerized simulation can be sped up from real time. Thus, the speed at which the computerized simulations can be executed depends on the speed of computer software/hardware on which the computerized simulations are executed. Computerized simulations are also tremendously cheaper to run, without requiring AVs to actually move in the physical world. Furthermore, computerized simulations are safer to execute, without endangering actual road occupants in the physical world.

As referred to herein, an "AI driver" is and includes a set of logic, algorithm, rules, instructions, codes, or a combination thereof that controls the manner in which an AV moves. In the context of the physical world, the AV driver can instruct the AV to move based on sensor data originating from various sensors (e.g., Global Positioning System (GPS), Light Detection and Ranging (LIDAR), radar, ultrasound sensor, camera, image sensor, and the like) on the AV. In other words, a computer system of the AV can send actuation commands to an engine, transmission, steering, a gas tank, brakes, signal lights, and other components of the AV in accordance with decisions of the AI driver. The AI driver can be stored in a memory unit and invoked as input to the computerized simulations described herein. In the context of computerized simulations, the AI driver can govern how a simulated AV object (referred to herein as an "ego vehicle object") moves within a simulated, virtual environment. The sensor data can be simulated, to allow the ego vehicle object virtual perception of its surrounding environment. The simulated sensor data is provided to the AI driver for the AI driver to determine driving decisions in the computerized simulations.

As referred to herein, a "human driver" is and includes human intelligence for driving a vehicle. A human driver can be introduced to the simulation via suitable input/output devices of the simulation system. In the context of computerized simulations, the human driver can control how an ego vehicle object moves within a simulated environment.

FIG. 1 is a block diagram illustrating an example of an AI driver system 100 according to various arrangements. Referring to FIG. 1, the AI driver system 100 can include at least a processing circuit 110, an environmental circuit 120, a driver circuit 130, a simulation circuit 140, an environment database 150, an AI driver database 160, an input device 170, and an output device 180 to implement features described herein.

The processing circuit 110 can be part of a workstation computer or other suitable types of computing device. The various circuits 120-140 for executing the various functions described herein can be implemented by the processing circuit 110 or another suitable processing unit. The processing circuit 110 includes a processor 112 and a memory 114.

The processor 112 includes any suitable data processing device, such as a general-purpose processor (e.g., a microprocessor). In the alternative, the processor 112 can be any conventional processor, controller, microcontroller, or state machine. The processor 112 can be implemented as a combination of computing devices, e.g., a combination of a Digital Signal Processor (DSP) and a microprocessor, a plurality of microprocessors, at least one microprocessor in conjunction with a DSP core, or any other such configuration. For example, the processor 112 can be but is not limited to being, an Intel® designed processor, AMD® designed processor, Apple® designed processor, QUALCOMM® designed processor, or ARM® designed process.

The memory 114 (or storage device) can be operatively coupled to the processor 112 and can include any suitable device for storing software instructions and data for controlling and use by the processor 112 to perform operations and functions described herein. Examples of the memory 114 include but are not limited to, Random Access Memory (RAM), Read Only Memory (ROM), floppy disks, hard disks, dongles or other Recomp Sensor Board (RSB) connected memory devices, or the like. The memory 114 can include non-transitory storage media that is configured to store information and instructions pertinent to the operation of the processor 112.

The memory 114 can send data to or receive data from the processor 112 and/or each of the circuits/components 120-180 in the AI driver system 100. In some examples, the memory 114 can be a remote storage device that stores data for the AI driver system 100 (or only the processing circuit 110) in a different node of a network than that on which the processing circuit 110 and/or the AI driver system 100 reside. In other examples, the memory 114 can be located on the same computer system (e.g., within the same node of the network) as the processing circuit 110 and/or the AI driver system 100. In other examples, one or more of the circuits 120-140 can be implemented with a dedicated memory unit that is separate from the memory 114.

The environment circuit 120 is configured to select and load a virtual environment based on which a computerized simulation is performed. The environment database 150 can store various virtual environments, each corresponds to a "risk scenario"—the computerized simulations can virtually simulate the circumstances and the environmental factors that may exist in actual road tests as realistic as possible. In one example, a risk scenario is turning left at an intersection that is managed by a traffic light and occupied by pedestrians and other vehicles.

Figure 2:
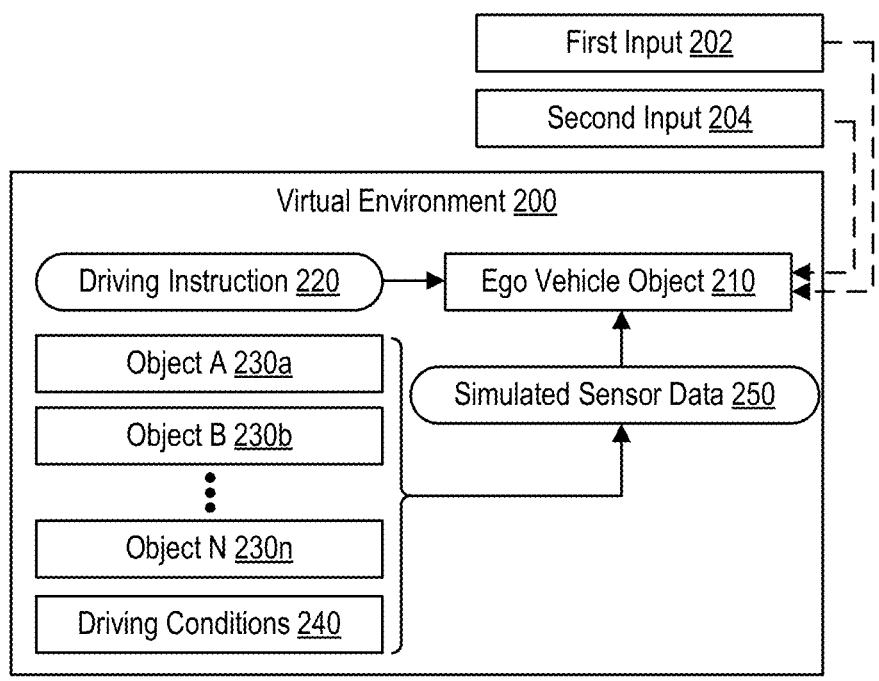
FIG. 2 is a schematic block diagram illustrating a virtual environment according to various arrangements.

FIG. 2 is a block diagram illustrating a virtual environment 200 according to various arrangements. Referring to FIGS. 1-2, the virtual environment 200 is one example of the various virtual environments stored in the environment database 150. The environment circuit 120 can generate the virtual environment 200. The virtual environment 200 includes at least an ego vehicle object 210, driving instruction 220, objects 230a-230n, and driving conditions 240.

The movement (e.g., acceleration, deceleration, velocity, speed, direction, and the like) of the ego vehicle object 210 can be controlled by a first input 202 or a second input 204 in a given simulation. The first input 202 can be an AI driver. The second input 204 can be one of a human driver, another AI driver different from the AI driver of the first input 202, the same AI driver as the AI driver of the first input 202, and a different version (e.g., a previous or a subsequent version) of the AI driver of the first input 202.

The AI driver database 160 stores various AI drivers, various versions of the same AI drivers, a combination thereof, and/or the like. The AI drivers stored in the driver database 160 can be called as the first input 202 or the second input 204 to a given simulation.

The driving instruction 220 (e.g., to turn left at an upcoming intersection, to follow a car in front, to turn left in a signalized intersections with pedestrians, and the like) commensurate with the risk scenario can be assigned to the first input 202 or the second input 204 within the context of the virtual environment 200. In some cases, the driving instruction 220 includes an assigned starting position in the virtual environment 200 and a task to be performed in the virtual environment 200. The task can include reaching a destination position from the starting position in one example. In another example, the task can include following another dynamic object (e.g., one of the objects 230a-230n).

Figure 3:
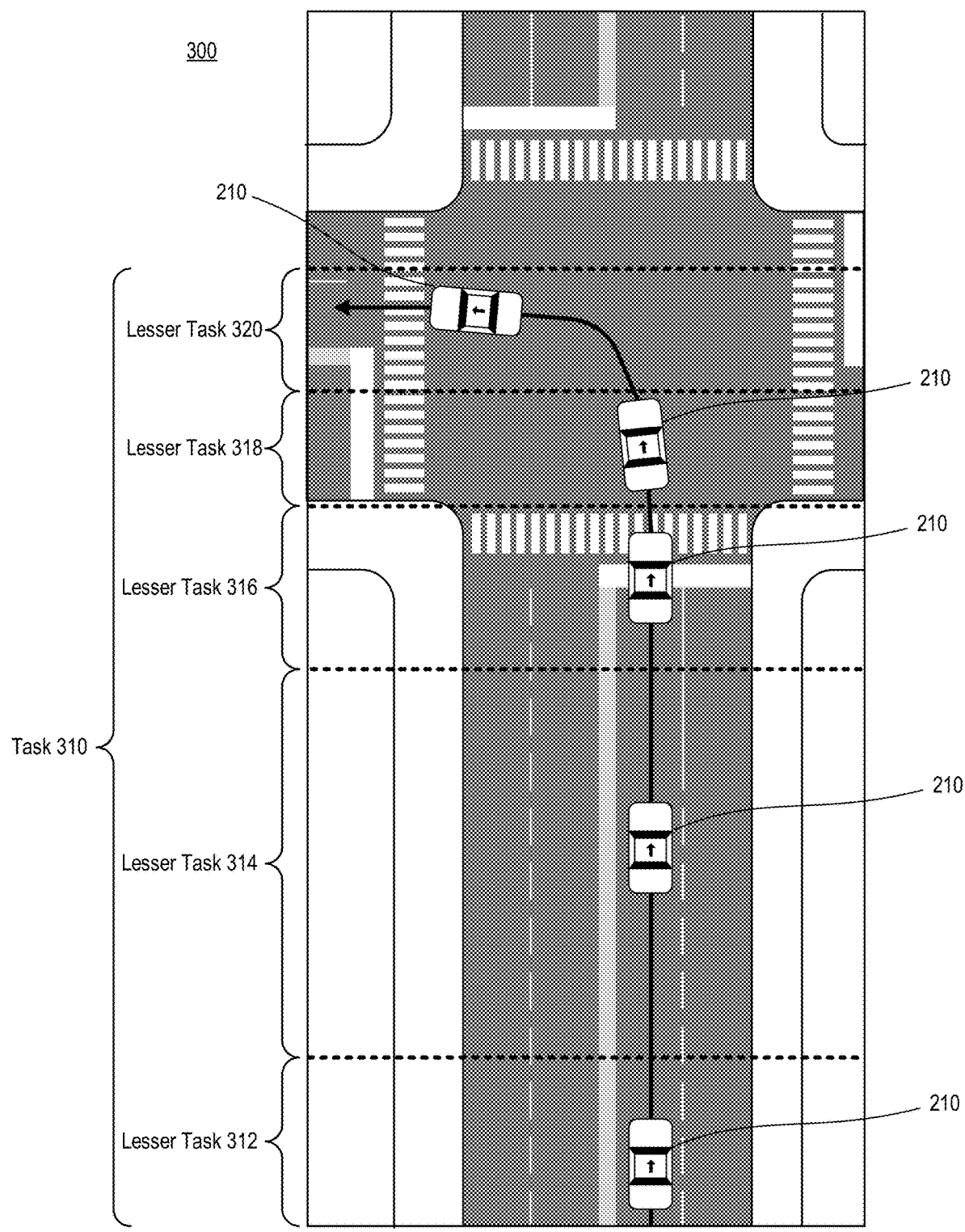
FIG. 3 is a schematic diagram illustrating a graphical representation of decomposing a task into lesser tasks according to various arrangements.

In some cases, the risk scenario can be decomposed into lesser tasks. Illustrating with a non-limiting example, the risk scenario of turning left at the intersection can be decomposed into the less tasks of approaching the intersection, decelerating, entering the intersection, preparing for the turn, executing the turn, accelerating after the turn, and the like. Each lesser task corresponds to one of lesser driving instructions, which make up the driving instruction 220. FIG. 3 is a schematic diagram illustrating a graphical representation 300 of decomposing a task 310 into lesser tasks 312-320 according to various arrangements. Referring to FIGS. 1-3, the task 310 corresponds to a risk scenario of the ego vehicle object 210 turning left on a green light. The task 310 is commensurate to the driving instruction 220. The lesser tasks 312-320 are approach, deceleration, intersection entry, prepare for turn, and execute the turn, respectively. As described, an overall safety quotient, a comfort parameter, a fuel efficiency parameter, a competence parameter, a path tracking parameter, and the like can be determined for each of the lesser tasks 312-320 to improve the granularity of machine learning the manner described. An overall safety quotient, a comfort parameter, a fuel efficiency parameter, a competence parameter, a path tracking parameter, and the like can be determined for the task 310 as a whole in other implementations.

The AI drivers can be first trained to perform a risk scenario (driving instruction) and less tasks (lesser driving instructions) included therein, for example, based on machine learning. In some arrangements, the AI drivers stored in the AI driver database 160 are trained using Deep Reinforcement Learning (DRL), which can likewise be provided by the AI driver system 100. In DRL training, an ego vehicle object (e.g., the ego vehicle object 210) is automatically positioned in a specific location of a virtual environment (e.g., the virtual environment 200). A task and risk scenario can be assigned for the AI driver to perform. For example, in a "follow-car-in-front" task/risk scenario, an ego vehicle object managed by an AI driver is positioned at a starting point and is instructed to follow a target vehicle object that is moving. The risk scenario terminates responsive to determining that the ego vehicle object collides with the target vehicle object or another object, or responsive to determining that a maximum duration/distance was reached without a crash. At the end of the risk scenario, the ego vehicle object is positioned at a different position or in a different virtual environment to perform the same exact task but for a different set of circumstances or environmental factors.

Once the AI driver can control the ego vehicle object to follow the target vehicle object without collisions or consistently have safety quotients above a threshold, additional factors are introduced to the virtual environment. Examples of the additional factors include but are not limited to, other vehicles encroaching into a lane occupied by the ego vehicle object, other traffic situations that force the ego vehicle object to stop suddenly, traffic signals (e.g., a yellow light) that force the ego vehicle object to slow down or to stop after the target vehicle object already passed the intersection, and the like. The AI driver improves by experiencing increasingly more complex virtual environments and risk scenarios. The AI driver learns the appropriate behavior by observing (e.g., based on the comparison parameters determined in the manner described herein) the safety quotient impact of decisions made with respect to a task or a lesser task.

Accordingly, manipulating the virtual environments to train the AI drivers is advantageous because the simulations allow control of various situations/risk scenarios based on which AI drivers can be trained to follow driving instructions (e.g., the driving instruction 220). Exposing the AI drivers to appropriate distribution of situations allows the AI drivers to achieve the desired safety characteristics in decision-making. Illustrating with a non-limiting example, exposing the AI driver to a virtual environment in which braking and swerving the ego vehicle object is needed to avoid accidents is important for training the AI driver to drive during winter on slippery roads. The environment circuit 120 feeds parameters (e.g., the simulated sensor data 250) relative to road traction by simulating standard traction sensor outputs.

The objects 230a-230n represent one or more objects virtually created in the virtual environment 200 to test the first input 202 and the second input 204. Each of the objects 230a-230n can be static (stationary) or dynamic (moving). Examples of a dynamic object include but are not limited to, another vehicle, a cyclist, a pedestrian, and the like. Examples of a static object include but are not limited to, a curb, a divider, a wall, a traffic light, a tree, and the like. A suitable algorithm or AI can control the dynamic objects in the virtual environment 200. A dynamic object can have a predetermined pattern or route of motion in some cases. In other cases, a dynamic object can be controlled by another suitable AI that moves the dynamic object based on motion of the ego vehicle object 210 and/or motion of other objects, for example, to avoid collision.

The driving conditions 240 include various parameters that represent weather, road conditions, street layout, laws, and the like. The laws refer to laws and regulations that govern traffic, including speed limits, traffic direction restrictions, stop signs, traffic lights, and the like.

Simulated sensor data 250 represents the perception of the objects 210a-230n and the driving conditions 240 by the ego vehicle object 210. In other words, the simulated sensor data 250 simulates sensor data outputted by sensors on an AV represented by the ego vehicle object 210. The simulated sensor data 250 simulates sensor data originating from various sensors such as but not limited to, GPS, LIDAR, radar, ultrasound sensor, camera, image sensor, and the like that are installable on an AV represented by the ego vehicle object 210. The environment circuit 120 converts the characteristics (e.g., dimensions, mass, velocity, position, and the like) of the objects 230a-230n and the driving conditions 240 present in the virtual environment 200 into corresponding simulated sensor data 250. The simulated sensor data 250 is in corresponding sensor standards for each type of virtual sensor.

The simulation circuit 140 can generate a uniform dashboard of the virtual environment 200 using the simulated sensor data 250 as input. The uniform dashboard can be in a suitable representation of the virtual environment 200 in a standardized format, to provide a uniform input based on which the AI drivers can generate actuation commands. The uniform dashboard can be in a pixelated image format as described in detail in Ser No. 15/902,894, titled "Automated Vehicle Artificial Intelligence Training Based on Simulations", filed Feb. 22, 2018, which is incorporated herein by reference in its entirety. The driver circuit 130 takes the simulated sensor data 250 (represented as the uniform dashboard or other suitable representations) as input, invokes the first input 202 or the second input 204 to generate actuation commands on how the ego vehicle object 210 should move. In other words, the driver circuit 130 facilitates the first input 202 and the second input 204 to determine how the ego vehicle object 210 should move to achieve the objective designated by the driving instruction 220, in view of the objects 230a-230n and the driving conditions 240.

The simulation circuit 140 is configured to execute virtual simulations involving at least one AI driver, to simulate and compare decisions of the AI driver with another AI driver or with a human driver. In particular, the simulation circuit 140 can perform a first simulation using the first input 202 to move the ego vehicle object 210 in the virtual environment 200 and a second simulation using the second input 204 to move the ego vehicle object 210 in the same virtual environment 200. The simulation circuit 140 compares the simulation results to improve the AI drivers involved in the simulations.

In a simulation phase, the simulation circuit 140 determines safety, comfort, fuel efficiency, competence, path tracking competence, and the like for various AI drivers as well as human drivers with respect to the risk scenario and/or each of the lesser tasks.

Comfort experienced by a hypothetical passenger or a simulated passenger can be represented using a comfort parameter. Illustrating with a non-limiting example, the comfort parameter is responsive to whether an acceleration of the ego vehicle object 210 exceeds a predetermined threshold, or responsive to whether the acceleration is increased rapidly (which may cause jerking of the hypothetical passenger or the simulated passenger).

Competence refers to an ability of an AI driver or a human driver to competently complete tasks associated with the driving instruction 220 or one or more lesser driving instructions associated thereof. In some example, the ego vehicle object 210 that remains static in a given location is safe, assuming no object collides with the ego vehicle object 210. However, this AI driver is not competent and will not complete the driving instruction 220 (e.g., to reach a predetermined destination). In some arrangements, time to complete a risk scenario or one or more lesser tasks (e.g., time to reach a destination position from an origin position) can used as a proxy or basis for determining the competence parameter. In some arrangements, spreading lane changes to multiple blocks ahead (as part of preparation for a left turn) is associated with a higher competence parameter than that associated with changing the same number of lanes at once within a same block.

Path tracking refers to an ability of an AI driver to faithfully follow a designated route or path or to reach destination location, taking into account obstacle avoidance, path planning, traffic laws, and other suitable factors. In some arrangements, a path tracking parameter indicating of such ability can be determined from suitable expressions, such as but not limited to:

$$S_{path\_tracking} = \exp(-x) \qquad (1)$$

where x is a distance between the ego vehicle object 210 and a designated path. $S_{path\_tracking}$ in expression (1) can be a value between 0 and 1. Thus, such formulation of the path tracking parameter aligns with and can be easily incorporated into the geometric average approach for determining an overall safety quotient described herein.

Such validation is made practical by leveraging the decomposition of the risk scenario into discrete lesser tasks and simulation's ability to control the virtual environment 200. Complexity of simulating a risk scenario depends on complexity of the risk scenario and complexity of each discrete lesser task included therein. Therefore the complexity of simulating the risk scenario can be controlled by controlling the complexity of each discrete lesser task. In other words, granular control is enabled by the arrangements described herein.

The simulation circuit 140 performs a computerized simulation using the first input 202 to the virtual environment 200 and performs another computerized simulation using the second input 204 to the virtual environment 200. The results are compared. In some arrangements, the simulation circuit 140 compares results from two different AI drivers, one used as the first input 202 and another used as the second input 204. In some arrangements, the simulation circuit 140 compares the results for an AI driver (as the first input 202) and a human driver (as the second input 204).

As referred to herein, a "safety quotient" is indicative of how safe a particular driver (e.g., an AI driver or a human driver) is as a result of a computerized simulation. In some arrangements, a safety quotient can be defined in terms of clearances between the ego vehicle object 210 and another object (e.g., one of objects 230a-230n) present in the virtual environment 200. In other words, a safety quotient can be determined with respect to an object (e.g., one of objects 230a-230n) in the context of the task 310 or in the context of each of the lesser tasks 312-320.

Illustrating with a non-limiting example, a safety quotient can be determined based on a static temporal clearance parameter, dynamic temporal clearance parameter, impact energy parameter, or a combination therefore.

As referred to herein, a "static temporal clearance parameter" is a time-based parameter that is indicative of the time it takes for the ego vehicle object 210 to contact an object (e.g., one of objects 230a-230n) that is assumed to be static. This means that with respect to an object in motion, the velocity of that object is not considered. In one non-limiting example, the static temporal clearance parameter, $T_{static}$, can be determined using the following expression:

$$T_{static} = \frac{D}{V_{ego}} \qquad (2)$$

where D is the distance between the ego vehicle object 210 and the object, and $V_{ego}$ is the velocity of the ego vehicle object 210. D is defined to be positive if the object is in front of the ego vehicle object 210 and/or if the ego vehicle object 210 is traveling toward the object. D is negative if the object is behind the ego vehicle object 210 and/or if the ego vehicle object 210 is traveling away from the object. $V_{ego}$ is defined to be positive in the direction that the ego vehicle object 210 is heading/facing. Each of D and $V_{ego}$ can be componentized. For example, in the Cartesian coordinates, D can be componentized as $D_x$, $D_y$, and $D_z$, and $V_{ego}$ can be componentized as $V_{ego-x}$, $V_{ego-y}$, and $V_{ego-z}$. The z-axis is normal to a camera plane. The x-axis is parallel to a road in the virtual environment 200. As the road curves, the x-axis and the z-axis may tilt accordingly in some arrangements. As such, $T_{static}$ is negative as the ego vehicle object 210 is moving away from the object. In response to determining that $T_{static}$ is negative (or D is negative), $T_{static}$ is set as $T_{max}$, and the object associated with $T_{max}$ can be ignored in determining the safety quotient. In other words, $T_{static}$ is ignored for the object that the ego vehicle object 210 has already passed.

As referred to herein, a "dynamic temporal clearance parameter" is a time-based parameter that is indicative of the time it takes for the ego vehicle object 210 to contact an object that is in motion (where the velocity of that object is non-zero). If the object is static (velocity of that object is 0), the dynamic temporal clearance parameter equals to the static temporal clearance parameter. In one non-limiting example, the dynamic temporal clearance parameter, $T_{dynamic}$, can be determined using the following expression:

$$T_{dynamic} = \frac{D}{V_{ego} - V_m} \qquad (3)$$

where D is the distance between the ego vehicle object 210 and the object, and $V_m$ is the velocity of the object. D is defined to be positive if the object is in front of the ego vehicle object 210 and/or if the ego vehicle object 210 is traveling toward the object. D is negative if the object is behind the ego vehicle object 210 and/or if the ego vehicle object 210 is traveling away from the object. $V_m$ is defined to be positive if the object is moving in the same direction as the ego vehicle object 210, negative otherwise. $V_m$ can also be componentized as $V_{m\text{-}x}$, $V_{m\text{-}y}$, and $V_{m\text{-}z}$. As such, $T_{dynamic}$ is negative as the ego vehicle object 210 is moving away from the object. In response to determining that $T_{dynamic}$ is negative or D is negative, $T_{dynamic}$ is set as $T_{max}$, and $T_{dynamic}$ of the object can be ignored. In other words, $T_{dynamic}$ is ignored for the object that the ego vehicle object 210 is moving away from. On the other hand, when D is positive and the ego vehicle object 210 is moving closer to the dynamic object, $T_{dynamic}$ is positive.

Typically, the more temporal clearance the ego vehicle object 210 has with respect to a particular object, the safer the situation is. This is because the AI drivers and the human drivers would have more time to react to the object in reality to take evasive actions. The implication is that if $T_{static}$ and/or $T_{dynamic}$ is small, the safety quotient becomes large, indicating that the situation is unsafe.

In some arrangements, both $T_{static}$ and $T_{dynamic}$ are both used to determine the safety quotient with respect to a particular object (e.g., one of the objects 230a-230n) other than the ego vehicle object 210. In one example, the ego vehicle object 210 is traveling on a freeway at 60 mph at a given point in time. The object A 230a is traveling at a similar speed (approximately 60 mph) in the same direction, 100 ft in the direction of motion of the ego vehicle object 210 on a same lane of the freeway. Given that the object A 230a is traveling at a similar speed, $V_{ego}-V_m$ is negligible. Therefore $T_{dynamic}$ is very large. In this case, $T_{dynamic}$ is set to $T_{max}$ and can be ignored. In contrast, $T_{static}$ with respect to the object A 230a is approximately 1.2 s, indicating that the ego vehicle object 210 may not be safe. Thus, although $T_{dynamic}$ with respect to the object A 230a can be ignored, $T_{static}$ with respect to the same object A 230a indicates that the situation is unsafe.

In another example, an object B 230b in motion and the ego vehicle object 210 are crossing an intersection, with the object B 230b ahead of the ego vehicle object 210 in a same direction of travel and traveling at a similar speed. As the object B 230b suddenly slows down due to unexpected pedestrian traffic, $T_{static}$ with respect to the object decreases as the distance between the object B 230b and the ego vehicle object 210 decreases. In addition, $T_{dynamic}$ decreases from $T_{max}$ because $V_{ego}-V_m$ increases as $V_m$ decreases. At some point, $T_{dynamic}$ overtakes $T_{static}$ as the more dominant temporal clearance parameter.

In another example, the object C 230c (e.g., an incoming vehicle) is traveling on a same lane as the ego vehicle object 210 toward the ego vehicle object 210, and the ego vehicle object 210 is traveling in an opposite direction toward the incoming object C 230c. The object C 230c is 1000 ft away from the ego vehicle object 210 and attempts to merge into another lane to avoid a head-on collision. In this case, $T_{static}$ is very large given that the object C 230c is very far away from the ego vehicle object 210. In contrast, $T_{dynamic}$ much less than $T_{static}$ (e.g., less than half of $T_{static}$) because the term $V_{ego}-V_m$ can be greater than $2V_{ego}$, given that $V_m$ is a negative term because the object C 230c is traveling in the direction opposite to that of the ego vehicle object 210. As such, $T_{dynamic}$ may be the dominant factor.

In some arrangements, energy of an imminent impact (embodied in an impact energy parameter) can be considered in determining the safety quotient. The larger the impact energy parameter is, the larger the safety quotient becomes, indicating that the situation is unsafe. Illustrating with a non-limiting example, $V_{ego}^2$ can be used as a suitable proxy for kinetic energy of an imminent impact with an object assumed to be static. Similarly, $(V_{ego}-V_m)^2$ can be used as a proxy for kinetic energy of an imminent impact with an object assumed to be in motion. This is due to the proportionality of $V_{ego}^2$ and $(V_{ego}-V_m)^2$ to kinetic energy. In some arrangements, the masses of the ego vehicle object 210 and/or the object with which the ego vehicle object 210 may collide can be further introduced in determining a more accurate proxy for kinetic energy, in addition to the velocity parameters. An object with more mass (e.g., a truck) produces more impact kinetic energy than that produced by another object with less mass (e.g., a sedan). In the instances in which the exact mass of a given object is difficult to determine, class-based estimation can be provided. For example, any sedan in a simulation environment is assigned a mass $m_s$, and any truck in a simulation environment is assigned a mass $m_t$. One of ordinary skill in the art can appreciate that other methods of determining or approximating kinetic energy for an imminent impact can be implemented.

As described herein, the safety quotient can be determined based on a combination of static temporal clearance parameter, dynamic temporal clearance parameter, and impact energy parameter. Illustrating with a non-limiting example, a safety quotient S with respect to a particular object can be determined using the following expression:

$$S = \frac{V_{ego}^2}{T_{static}} + \frac{(V_{ego}-V_m)^2}{T_{dynamic}} \tag{4}$$

where the static temporal clearance parameter and the dynamic temporal clearance parameter are both determined for the same object, irrespective of whether that object is moving or not.

One of ordinary skill in the art can appreciate the other formulations of the safety quotient can be indicative of unsafe or unlawful actions (e.g., traffic compliance) by the ego vehicle object 210. For example, a traffic compliance safety quotient (or a traffic compliance parameter) $jS_{driving\_direction}$ can be defined with respect to a driving direction of the ego vehicle object 210, such that $S_{driving\_direction}$ is 1 if the ego vehicle object 210 is being moved in a direction of traffic for a particular lane, and 0 if the ego vehicle object 210 is not being moved in the direction of traffic for the particular lane. Such definition of the traffic compliance safety quotient aligns with the geometric weighted average approach described herein. Implementing the geometric weighted average approach, the ego vehicle object 210 driving in a direction opposite to traffic will render the overall safety quotient to be 0, because $S_{driving\_direction}=0$. In other words, the traffic compliance safety quotient is indicative of whether the ego vehicle object 210 is violating traffic laws and regulations. The traffic compliance safety quotient can correspond to the ego vehicle object 210 running a red light, not stopping at a stop sign, driving opposite to traffic on a one-way street, and the like.

Other formulations of the safety quotient can be indicative of encoding of lane information (without which every left turn may be determined to be unsafe).

In some arrangements, the simulation circuit 140 can determine an overall safety quotient of the virtual environment 200, which is an aggregation of multiple component safety quotients, each of which corresponds to one of the objects 230a-230n, unsafe/unlawful actions of the ego vehicle object 210, or lane encoding information. For example, in the virtual environment 200 in which multiple objects 230a-230n exist in addition to the ego vehicle object 210, a component safety quotient with respect to each of the objects 230a-230n can be determined and aggregated. The component safety quotient with respect to an object can be determined based on a component static temporal clearance parameter relative to the object, a component dynamic temporal clearance parameter relative to the object, and an impact energy parameter relative to the object. The overall safety quotient can aggregate component safety quotients with respect to the objects in the virtual environment 200.

An overall safety quotient with respect to the entire virtual environment 200 may be determined as a sum of the safety quotients with respect to the objects 230a-230n in one example. In another example, the overall safety quotient with respect to the entire virtual environment 200 may be determined as a regular average of the component safety quotients. In yet another example, the overall safety quotient is a weighted geometric average of various component safety quotients, each of which corresponds to an individual object, an unsafe/unlawful action, lane coding information, or the like. In determining the weighted geometric average, each component safety quotient is raised to the power of a corresponding weight, and the results are multiplied. For example, the overall safety quotient can be determined from suitable expressions, such as but not limited to:

$$SQ_{overall} = \prod_{i=1}^{n} S_i^{w_i} \quad (5)$$

where $SQ_{overall}$ is the overall safety quotient, which according to the expression above, is defined by a collection of component safety quotients $S_i$, taking into account a corresponding weight $w_i$.

Illustrating with a non-limiting example, if a component safety quotient for an unlawful action (e.g., driving in an opposite direction on a one-way street, running a red light, and the like) is set to be 0, the overall safety quotient with respect to the entire virtual environment 200 becomes 0 due to the multiplication, even if there are no other traffic participant objects. In other words, in using the weighted geometric average approach, the overall safety quotient is 0 (very unsafe), if any component safety quotient is 0 (one aspect of the virtual environment 200 is very unsafe).

In some arrangements, safety quotients of an AI driver in different weather conditions are compared. In such arrangements, the same AI driver is used as both the first input 202 and the second input 204, in different respective simulations in which the weather conditions of the driving conditions 240 are different while everything else in the virtual environment 200 remains constant. In some arrangements, two virtual sensor outputs for a same driver are compared. In such arrangements, the same AI or human driver is used as both the first input 202 and the second input 204, in different respective simulations in which the simulated sensor data 250 output is different while everything else in the virtual environment 200 remains constant. In some arrangement, safety quotients for an AI driver with respect to two different virtual environments (e.g., entering two intersections with different circumstances and environmental factors) are compared. One of ordinary skill in the art can appreciate that other parameters can be compared to determine a superior input (the first input 202 or the second input 204). By defining a superior input, the AI driver can analyze its own behavior and that of another AI or human driver to perform reinforced learning (e.g., DRL) in a trial-and-error basis.

The input device 170 receives input from an operator of the AI driver system 100. The output device 180 provides information to the operator. The input device 170 can be combined with, or separated from, the output device 180. The input device 170 and the output device 180 can be operatively coupled to the processing circuit 110 for communicating information and command selections. For example, the input device 170 can include a keyboard, a keypad, a mouse, a joystick, a touch screen display, a microphone, or other suitable input devices performing similar functions. In particular, the input device 170 can include a cursor control device, such as, but not limited to, a mouse, trackball, touch screen, motion sensor, cursor direction keys, and the like. The input device 170 can include a touch screen interface or movement sensing interface that can be combined with, or separated from, the output device 180. The output device 180 can be any type of display such as but not limited to, a Cathode Ray Tube (CRT) display, a Liquid Crystal Display (LCD) display, a Light Emitting Diode (LED) display, a sound output device (e.g., speakers), a tactile feedback (e.g., vibrations) device, a virtual reality (VR) device, an augmented reality (AR) device, and the like.

The operator can use the input device 170 and the output device 180 to provide human driver input to the computerized simulations as the second input 204. For instance, the input device 170 and the output device 180 can be a driving simulation device including a joy stick, a keyboard, a mouse, a wheel, paddles, transmission sticks, dashboard panel, and/or the like that simulates a driving experience to receive user input with respect to the virtual environment 200. The output device 180 can output audiovisual information relative to the driving instructions 220 (in the form of texts, graphical direction indicators or arrows, and the like), the objects 230a-230n, and the driving conditions 240 via a screen, a VR device, or an AR device.

Figure 4:
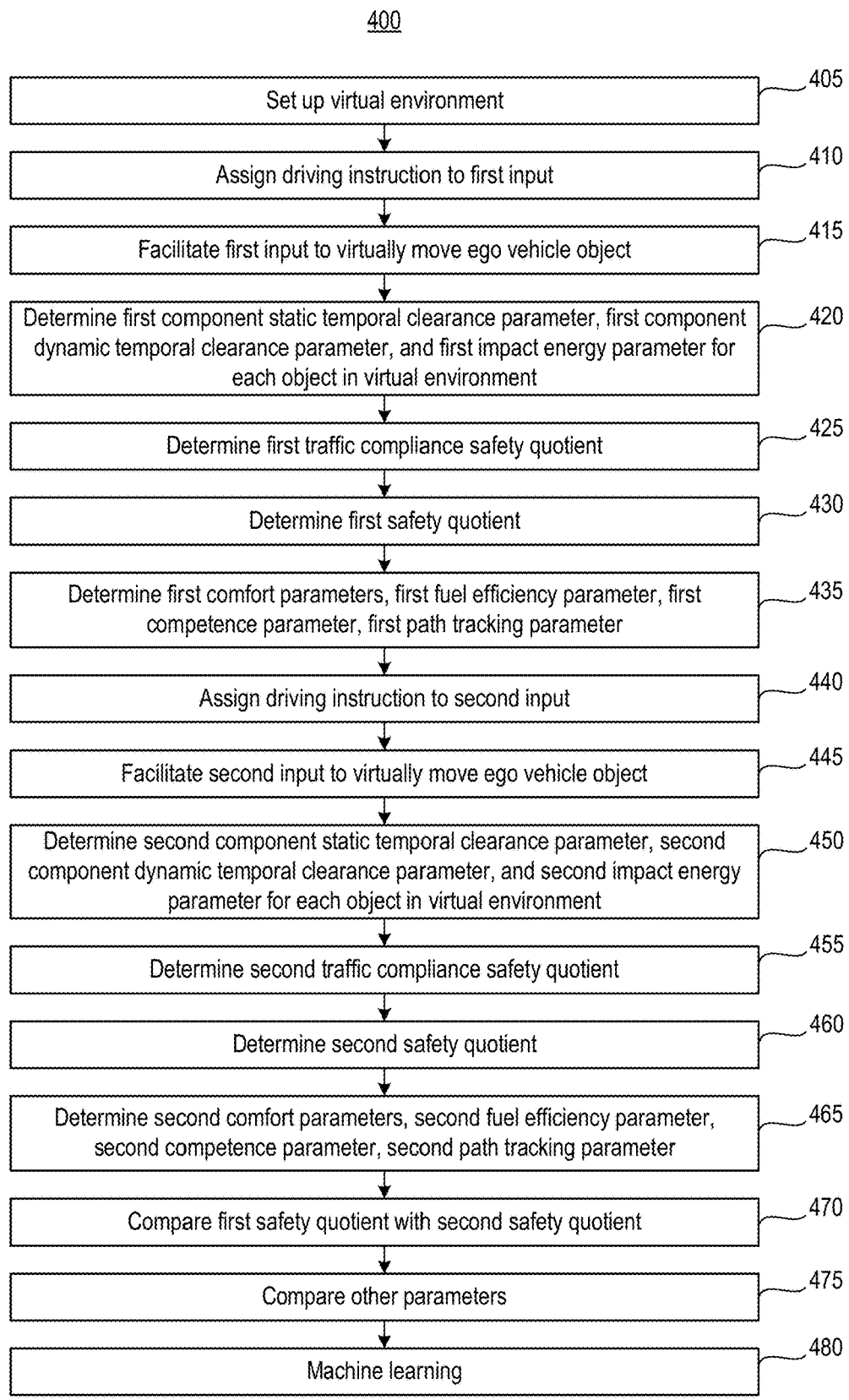
FIG. 4 is a process flow diagram illustrating an example of a method for simulating and improving performance of an AI driver according to various arrangements.

FIG. 4 is a process flow diagram illustrating an example of a method 400 for simulating and improving performance of an AI driver according to various arrangements. Referring to FIGS. 1-3, the method 300 can be performed by the AI driver system 100. Generally, the environment circuit 130 sets up computerized simulations, each corresponds to a virtual environment such as but not limited to, the virtual environment 200. A first computerized simulation in which the first input 202 controls the ego vehicle object 210 is executed to determine results (e.g., a first safety quotient). A second computerized simulation in which the second input 204 controls the ego vehicle object 210 is executed to determine results (e.g., a second safety quotient). The results from two simulations are compared. The AI driver associated with the first input 202 can be improved by learning from the comparison, which defines a superior input. In some instances in which the second input 204 is an AI driver, the second input 204 can be likewise improved from the comparison.

At 405, the environment circuit 130 sets up the virtual environment 200. The environmental circuit 130 can automatically select a virtual environment from the environmental database 150 based on suitable criteria such as but not limited to, characteristics (e.g., dimensions, mass, velocity, number, and the like) of objects desired to be present in the simulation, types driving conditions or environmental factors (e.g., weather, road conditions, street layout, laws, and the like), characteristics (e.g., marker, model, dimensions, mass, velocity, number, and the like) of the ego vehicle object, and the like. Given that multiple iterations of the same simulation and different simulations are executed, a suitable rule database or algorithm can be implemented for selecting the criteria. The criteria can be received from by the input device 170 as user input in some instances.

At 410, the environment circuit 130 can assign the driving instructions 220 to the first input 202. As described, the virtual environment 200 includes the driving instruction 220, which defines one or more objectives for the ego vehicle object 210 to achieve in the context of a particular execution of the computerized simulation. As described, the driving instruction 220 can include multiple lesser driving instructions.

At 415, the driver circuit 130 facilitates the first input 202 to virtually move the ego vehicle object 210 to execute the driving instruction 220. For example, the first input 202 can determine a series of virtual actuation commands to execute the driving instruction 220 responsive to the simulated sensor data 250. The driver circuit 130 receives the virtual actuation commands, provides corresponding virtual actuations to the ego vehicle object 210, and determines the virtual motion of the ego vehicle object 210.

At 420, the simulation circuit 140 determines a first component static temporal clearance parameter, a first component dynamic temporal clearance parameter, and a first impact energy parameter for each of the objects 230a-230n in the virtual environment 200. Such determination takes into account the position, the motion, and the mass of the ego vehicle object 210 as well as the position, the motion, and the mass of each of the objects 230a-230n during the simulation. The first component static temporal clearance parameter with respect to an object can be determined, for example, using expression (2). The first component dynamic temporal clearance parameter with respect to the object can be determined, for example, using expression (3).

At 425, the simulation circuit 140 determines a first traffic compliance safety quotient based on the motion of the ego vehicle object 210 in the manner described.

At 430, the simulation circuit 140 determines a first safety quotient. The first safety quotient represents the overall safety quotient of the virtual environment 200 in which the first input 202 is used. In one example, the simulation circuit 140 determines a component safety quotient with respect to each of the objects 230a-230n using expression (4), which accounts for a component static temporal clearance parameter, a component dynamic temporal clearance parameter, and an impact energy parameter.

The first safety quotient can be an aggregation the component safety quotients with respect to the objects 230a-230n, the traffic compliance safety quotient, and the lane encoding information safety quotient in the manner described. For example, the first safety quotient can be a sum, regular average, or weighted geometric average of the component safety quotients for the objects 230a-230n, the traffic compliance safety quotient, and the lane encoding information safety quotient. In some arrangements in which the driving instruction 220 includes multiple lesser driving instructions, an overall safety quotient corresponding to each of the multiple lesser driving instructions can be determined. This allow the simulation circuit 140 to compare the first input 202 and the second input 204 with respect to each lesser driving instruction to grain granular insights.

At 435, the simulation circuit 140 determines other parameters such as but not limited to a first comfort parameter, a first fuel efficiency parameter, a first competence parameter, a first path tracking parameter, and the like based on the motion of the ego vehicle object 210 in the manner described.

At 440-465, the AI driver system 100 executes another computerized simulation based on the same virtual environment 200, this time using the second input 204 to manage the ego vehicle object 210. The simulation circuit 140 can sent up the virtual environment 200 for this second computerized simulation if needed. At 440, the environment circuit 130 can assign the driving instructions 220 to the second input 204. At 445, the driver circuit 130 facilitates the second input 204 to virtually move the ego vehicle object 210 to execute the driving instruction 220. In the examples in which the second input 204 is an AI driver, the second input 204 can determine a series of virtual actuation commands to execute the driving instruction 220 responsive to the simulated sensor data 250. The driver circuit 130 receives the virtual actuation commands, provides corresponding virtual actuations, and determines the virtual motion of the ego vehicle object 210. In the examples in which the second input 204 is a human driver, the driver circuit 130 converts user inputs received via the input device 170 into the virtual motion of the ego vehicle object 210.

At 450, the simulation circuit 140 determines a second component static temporal clearance parameter, a second component dynamic temporal clearance parameter, and a second impact energy parameter for each of the objects 230a-230n in the virtual environment 200. At 455, the simulation circuit 140 determines a second traffic compliance safety quotient based on the motion of the ego vehicle object 210 in the manner described.

At 460, the simulation circuit 140 determines a second safety quotient. The second safety quotient represents the overall safety quotient of the virtual environment 200 in which the second input 204 is used. In one example, the simulation circuit 140 determines a component safety quotient with respect to each of the objects 230a-230n using expression (4), which accounts for a component static temporal clearance parameter, a component dynamic temporal clearance parameter, and an impact energy parameter. The second safety quotient can be an aggregation the component safety quotients with respect to the objects 230a-230n, the traffic compliance safety quotient, and the lane encoding information safety quotient in the manner described.

At 465, the simulation circuit 140 determines other parameters such as but not limited to a second comfort parameter, a second fuel efficiency parameter, a second competence parameter, a second path tracking parameter, and the like based on the motion of the ego vehicle object 210 in the manner described.

At 470, the simulation circuit 140 compares the first safety quotient with the second safety quotient. By comparing the safety quotients, the simulation circuit 140 can identify a superior driver in terms of safety. In the non-limiting examples described with respect to expressions (2)-(5), the larger the safety quotient is, the more the driver is unsafe. At 475, the simulation circuit 140 compares other parameters such as but not limited to, comparing the first and second comfort parameters, the first and second fuel efficiency parameters, the first and second competence parameters, and the first and second path tracking parameters. The comparisons at 470 and 475 can serve as basis for machine learning to improve the AI driver corresponding to the first input 202 (and the AI driver corresponding to the second input 204, if any), at 480.

For example, based on such comparisons, the simulation circuit 140 can select one of the first input 202 and the second input 204 as the superior driver in the context of the virtual environment 200 by analyzing the safety quotient comparison at 470 and other parameters comparison at 475. For instance, the input with the higher overall safety quotient can be selected as the superior driver with respect to safety. The input with the higher comfort parameter, fuel efficiency parameter, competence parameter, and path tracking parameter can be selected as the superior driver with respect to comfort, fuel efficiency, competence, and path tracking, respectively. Due to the duplicative nature of the virtual environment 200, the AI driver for the first input 202 can perform reinforced machine learning (e.g., DRL) based on the actuation decisions and the motions of the ego vehicle object 210 as controlled by the first input 202 or the AI/human driver for the second input 204, knowing which driver is superior in a specific category of attributes. This provides feedback examples necessary in machine learning in the context of two completely identical computerized simulations, something that does not occur in the physical world.

As described, the task commensurate with the driving instruction 220 can be divided into lesser tasks. The safety quotients, comfort parameters, fuel efficiency parameters, competence parameters, and path tracking parameters with respect to each of the first input 202 and the second input 204 can be determined for each lesser task and compared. An AI or human driver that performs one part of a task well may not perform another part of the task well. As such, the granularity provided by the divisions of the task allows the AI drivers to learn on a granular basis, such that the performance of the AI drivers can be improved more efficient.

In some arrangements, multi-agent DRL training can be implemented. In a simulated environment implementing multi-agent training, multiple ego vehicle objects are controlled by the same version of an AI driver or by different versions (e.g., from previous risk scenarios, upon which the current version improves) of the AI driver. This expedites learning by about two orders of magnitude (i.e. greater than 100 times) due to simultaneously simulating multiple vehicle objects in a single data structure. This promotes computational efficiency and enriches the AI driver with additional situations, thus improving training efficiency because multiple AI drivers are trained in a same simulated environment. The performance of the AI driver(s) controlling different ego vehicle objects in a same simulation can be compared in some arrangements. In other arrangements, the performance of the AI driver(s) with respect to each ego vehicle object in the simulation is compared to the performance of another AI driver or human driver in a different simulation in the manner described.

Experiments show that convergence of multi-agent DRL training can be relatively faster. On the other hand, too many "bad drivers" (e.g., other vehicle objects managed by the same or different versions of the AI drivers) unduly increases simulation complexity.

Figure 5:
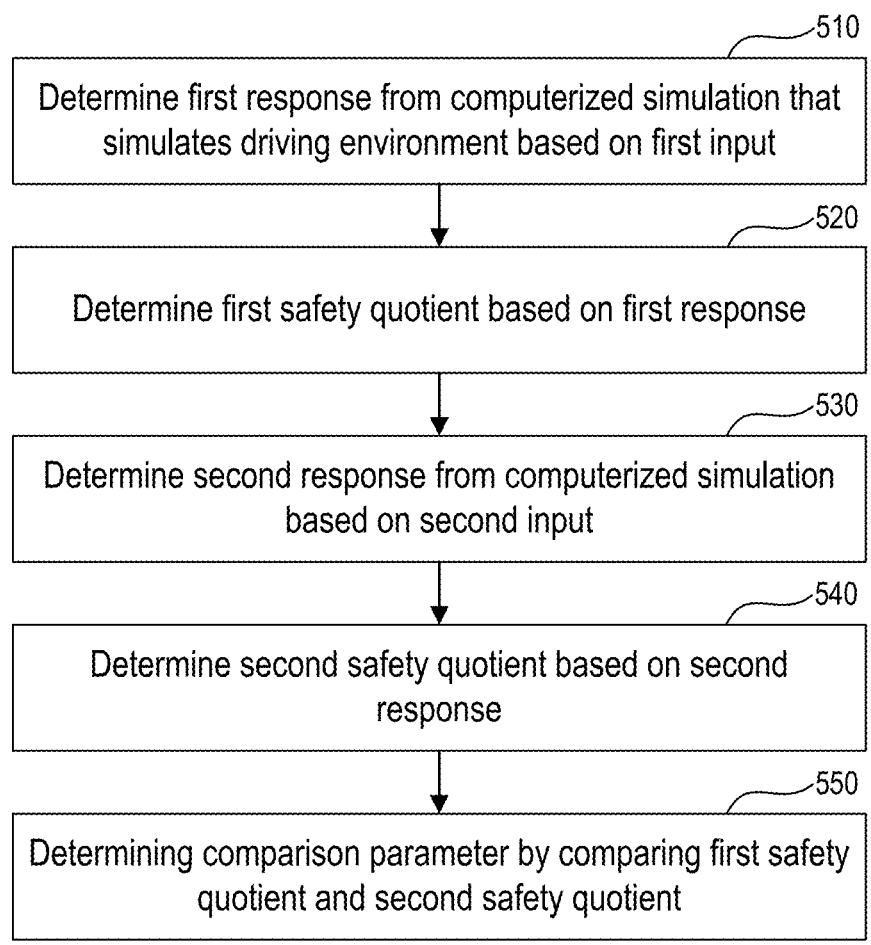
FIG. 5 is a process flow diagram illustrating an example of a method for simulating and improving performance of an AI driver according to various arrangements.

FIG. 5 is a process flow diagram illustrating an example of a method 500 for simulating and improving performance of an AI driver according to various arrangements. Referring to FIGS. 1-5, the method 500 can be performed by the AI driver system 100. Each of 510-550 corresponds to one or more of 405-480.

At 510, the simulation circuit 140 determines, based on the first input 202, a first response from a first computerized simulation that simulates a driving environment. As described, the simulation circuit 140 can create the virtual environment 200 that simulates the driving environment. The first input 202 controls the motion of the ego vehicle object 210. The first response is measured for the motion as controlled by the first input 202. The first response refers to at least the first static temporal clearance parameter, the first dynamic temporal clearance parameter, and the first traffic compliance parameter. The first static temporal clearance parameter may refer to first component static temporal clearance parameter, each of which is determined with respect to one of the objects 230a-230n. The first dynamic temporal clearance parameter may refer to first component dynamic temporal clearance parameters, each of which is determined with respect to one of the objects 230a-230n.

In the arrangements in which the driving instruction 220 includes multiple lesser driving instructions, the simulation circuit 140 determines multiple first responses, one for each lesser driving instruction. The simulation circuit 140 can determine a first safety quotient for each of such first responses in such arrangements.

At 520, the simulation circuit 140 determines the first safety quotient based on the first response. The first safety quotient can be determined for the entire task or for each lesser task.

At 530, the simulation circuit 140 determines, based on the second input 204, a second response from a second computerized simulation based on the virtual environment 200. The second input 204 controls the motion of the ego vehicle object 210. The second response is measured for the motion as controlled by the second input 204. The second response refers to at least the second static temporal clearance parameter, the second dynamic temporal clearance parameter, and the second traffic compliance parameter. The second static temporal clearance parameter may refer to second component static temporal clearance parameter, each of which is determined with respect to one of the objects 230a-230n. The second dynamic temporal clearance parameter may refer to second component dynamic temporal clearance parameters, each of which is determined with respect to one of the objects 230a-230n.

In the arrangements in which the driving instruction 220 includes multiple lesser driving instructions, the simulation circuit 140 determines multiple second responses, one for each lesser driving instruction. The simulation circuit 140 determines a second safety quotient for each of such first responses.

At 540, the simulation circuit 140 determines the second safety quotient based on the second response. The second safety quotient can be determined for the entire task or for each lesser task.

At 550, the simulation circuit 150 determines a comparison parameter by comparing the first safety quotient and the second safety quotient. The comparison can be performed for the entire task or for each lesser task. The comparison parameter can be used to define a superior driver, such that data recorded in the two simulations can be used as inputs to machine learning.

While the methods 400 and 500 relate to performing two simulations using the same virtual environment 200, with the controller of the ego vehicle object 210 being different, comparisons based on different simulation environment can also improve the AI drivers. For example, two computerized simulations using the same AI driver as input to control the ego vehicle objects in those simulations can be performed. The computerized simulations may have virtual environments that differ in simulated weather conditions, street layout, objects present, and the like. The safety quotients, comfort parameters, fuel efficiency parameters, competence parameters, and path tracking parameters can be similarly compared to determine a superior driver.

The terms "system," "logic," "module," "data processing apparatus," or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary examples are illustrative only. Although only a few examples have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. Other substitutions, modifications, changes, and omissions can be made in the design, operating conditions and arrangement of the exemplary examples without departing from the scope of the present disclosure.

The present disclosure contemplates methods, systems and program products on any machine-readable media for accomplishing various operations. The examples of the present disclosure can be implemented using existing computer processors, or by a special purpose computer processor for an appropriate system, incorporated for this or another purpose, networked systems or by a hardwired system. Examples within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions can be executed on any type of computing device (e.g., computer, laptop, etc.) or can be embedded on any type of electronic device (e.g., a portable storage device such as a flash drive, etc.).

Although the figures can show a specific order of method steps, the order of the steps can differ from what is depicted. Also, two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision step.

What is claimed is:

1. A method for simulating and improving performance of an artificial intelligence (AI) driver, comprising:
    determining a first response from a first computerized simulation that simulates a driving environment based on a first input controlling a first ego vehicle object that represents an automated vehicle (AV) in the first computerized simulation, wherein the first response comprises at least one of a first static temporal clearance parameter, a first dynamic temporal clearance parameter, and a first traffic compliance parameter, the first input being the AI driver;
    determining a first safety quotient based on the first response;
    determining a second response from a second computerized simulation based on a second input controlling a second ego vehicle object that represents an AV in the second computerized simulation, wherein the second response comprises at least one of a second static temporal clearance parameter, a second dynamic temporal clearance parameter, and a second traffic compliance parameter;
    determining a second safety quotient based on the second response;
    determining a comparison parameter by comparing the first safety quotient determined based on the first computerized simulation and the second safety quotient determined based on the second computerized simulation, wherein the comparison parameter indicates which one of the first input and the second input is a superior input; and
    training the AI driver using the comparison parameter.

2. The method of claim 1, further comprising setting up the first and second computerized simulations by setting up an virtual environment to be used in each of the first and second computerized simulations, wherein the virtual environment comprises the first ego vehicle object or the second ego vehicle object, wherein the virtual environment further comprises at least one of a static object and a dynamic object.

3. The method of claim 2, further comprises assigning a driving instruction to the first input, wherein determining the first response comprises determining motion of the first ego vehicle object corresponding to the first input executing the driving instruction, wherein the first response is measured for the motion of the first ego vehicle object.

4. The method of claim 3, wherein
the driving instruction comprises a plurality of lesser driving instructions;
determining the first response comprises determining one of a plurality of first responses for each of the plurality of lesser driving instructions; and
determining the first safety quotient based on the first response comprises determining a first safety quotient for each of the plurality of first responses.

5. The method of claim 3, wherein determining the first response from the first computerized simulation comprises:
feeding simulated sensory data corresponding to the at least one of the static object and the dynamic object to the first ego vehicle object;
moving the first ego vehicle object based on the first input, wherein the first input determines motion of the first ego vehicle object to perform the driving instruction based on the simulated sensory data.

6. The method of claim 2, wherein the virtual environment further comprises simulated weather conditions.

7. The method of claim 2, wherein
the first ego vehicle object is assigned a starting position in the first computerized simulation and a task to be performed in the first computerized simulation, wherein the task comprises reaching a destination position from the starting position.

8. The method of claim 1, further comprising reinforcing the AI driver with the first safety quotient or with the comparison parameter using Deep Reinforcement Learning (DRL).

9. The method of claim 1, wherein the second input is one of:
another AI driver different from the AI driver;
the same AI driver; and
a previous version of the same AI driver.

10. The method of claim 9, wherein AIs associated with the first input and the second input are trained using multi-agent Deep Reinforcement Learning (DRL).

11. The method of claim 1, further comprising:
determining at least one of a first comfort parameter, a first fuel economy parameter, a first competence parameter, and a first path tracking competence parameter based on the first response;
determining at least one of a second comfort parameter, a second fuel economy parameter, a second competence parameter, and a second path tracking competence parameter based on the second response; and
determining another comparison parameter by comparing the first comfort parameter with the second comfort parameter, by comparing the first fuel economy parameter with the second fuel economy parameter, by comparing the first competence parameter with the second competence parameter, or by comparing the first path tracking competence parameter with the second path tracking competence parameter.

12. The method of claim 1, further comprising:
determining a third response from a third computerized simulation that simulations another driving environment based on the first input, wherein the driving environment and the another driving environment differs in at least one of simulated weather conditions, street layout, or objects present; and
comparing the first response from the third response.

13. The method of claim 1, wherein the first safety quotient is an overall safety quotient defined as a regular average or a weighted geometric average of a plurality of first component safety quotients, each of the plurality of first component safety quotients corresponds to an object in the first computerized simulation or an unsafe or unlawful action performed by the first an ego vehicle object in the first computerized simulation.

14. The method of claim 13, wherein
the first static temporal clearance parameter comprises a first component static temporal clearance parameter relative to an object in the driving environment;
the first dynamic temporal clearance parameter comprises a first component dynamic temporal clearance parameter relative to the object; and
one of the plurality of first component safety quotients is determined based on the first component static temporal clearance parameter, the first component dynamic temporal clearance parameter, and an impact energy parameter relative to the object.

15. The method of claim 1, wherein the first traffic compliance parameter is a first traffic compliance safety quotient that positively influences the first safety quotient responsive to the first ego vehicle object controlled by the first input abides by traffic laws defined for the first computerized simulation and negatively influences the first safety quotient responsive to the first ego vehicle object violates the traffic laws.

16. A non-transitory computer-readable medium having computer-readable instructions such that, when executed by a processor, causes the processor to simulate and improve performance of an artificial intelligence (AI) driver by:
determining a first response from a first computerized simulation that simulates a driving environment based on a first input controlling a first ego vehicle object that represents an automated vehicle (AV) in the first computerized simulation, wherein the first response comprises at least one of a first static temporal clearance parameter, a first dynamic temporal clearance parameter, and a first traffic compliance parameter, the first input being the AI driver;
determining a first safety quotient based on the first response;
determining a second response from a second computerized simulation based on a second input controlling a second ego vehicle object that represents an AV in the second computerized simulation, wherein the second response comprises at least one of a second static temporal clearance parameter, a second dynamic temporal clearance parameter, and a second traffic compliance parameter;
determining a second safety quotient based on the second response;
determining a comparison parameter by comparing the first safety quotient determined based on the first computerized simulation and the second safety quotient determined based on the second computerized simulation, wherein the comparison parameter indicates which one of the first input and the second input is a superior input; and
training the AI driver using the comparison parameter.

17. The non-transitory computer-readable medium of claim 16, wherein the processor is further configured to set up the first and second computerized simulations by setting up an virtual environment to be used in each of the first and second computerized simulations, wherein the virtual environment comprises the first ego vehicle object or the second ego vehicle object, wherein the virtual environment further comprises at least one of a static object and a dynamic object, wherein the ego vehicle object represents an automated vehicle (AV).

18. The non-transitory computer-readable medium of claim 17, wherein the processor is further configured to assign a driving instruction to the first input, wherein determining the first response comprises determining motion of the first ego vehicle object corresponding to the first input executing the driving instruction, wherein the first response is measured for the motion of the first ego vehicle object.

19. The non-transitory computer-readable medium of claim 18, wherein
the driving instruction comprises a plurality of lesser driving instructions;
determining the first response comprises determining one of a plurality of first responses for each of the plurality of lesser driving instructions; and
determining the first safety quotient based on the first response comprises determining a first safety quotient for each of the plurality of first responses.

20. The non-transitory computer-readable medium of claim 18, wherein determining the first response from the first computerized simulation comprises:
feeding simulated sensory data corresponding to the at least one of the static object and the dynamic object to the first ego vehicle object;
moving the first ego vehicle object based on the first input, wherein the first input determines motion of the first ego vehicle object to perform the driving instruction based on the simulated sensory data.

21. The non-transitory computer-readable medium of claim 16, wherein the processor is further configured to reinforce the AI driver with the first safety quotient or with the comparison parameter using Deep Reinforcement Learning (DRL).

22. The non-transitory computer-readable medium of claim 16, wherein the second input is one of:
another AI driver different from the AI driver;
the same AI driver; and
a previous version of the same AI driver.

23. The non-transitory computer-readable medium of claim 22, wherein AIs associated with the first input and the second input are trained using multi-agent Deep Reinforcement Learning (DRL).

24. The non-transitory computer-readable medium of claim 16, wherein the processor is further configured to:
determine at least one of a first comfort parameter, a first fuel economy parameter, a first competence parameter, and a first path tracking competence parameter based on the first response;
determine at least one of a second comfort parameter, a second fuel economy parameter, a second competence parameter, and a second path tracking competence parameter based on the second response; and
determine another comparison parameter by comparing the first comfort parameter with the second comfort parameter, by comparing the first fuel economy parameter with the second fuel economy parameter, by comparing the first competence parameter with the second competence parameter, or by comparing the first path tracking competence parameter with the second path tracking competence parameter.

25. The non-transitory computer-readable medium of claim 16, wherein the processor is further configured to:
determine a third response from a third computerized simulation that simulations another driving environment based on the first input, wherein the driving environment and the another driving environment differs in at least one of simulated weather conditions, street layout, or objects present; and
compare the first response from the third response.

26. The non-transitory computer-readable medium of claim 16, wherein the first safety quotient is an overall safety quotient defined as a regular average or a weighted geometric average of a plurality of first component safety quotients, each of the plurality of first component safety quotients corresponds to an object in the first computerized simulation or an unsafe or unlawful action performed by the first vehicle object in the first computerized simulation.

27. The non-transitory computer-readable medium of claim 16, wherein
the first static temporal clearance parameter comprises a first component static temporal clearance parameter relative to an object in the driving environment;
the first dynamic temporal clearance parameter comprises a first component dynamic temporal clearance parameter relative to the object; and
one of the plurality of first component safety quotients is determined based on the first component static temporal clearance parameter, the first component dynamic temporal clearance parameter, and an impact energy parameter relative to the object.

28. The non-transitory computer-readable medium of claim 16, wherein the first traffic compliance parameter is a first traffic compliance safety quotient that positively influences the first safety quotient responsive to the first ego vehicle object controlled by the first input abides by traffic laws defined for the first computerized simulation and negatively influences the first safety quotient responsive to the first ego vehicle object violates the traffic laws.

29. An apparatus capable of simulating and improving performance of an artificial intelligence (AI) driver, the apparatus comprises:
at least one memory;
at least one processor configured to:
determine a first response from a first computerized simulation that simulates a driving environment based on a first input controlling a first ego vehicle object that represents an automated vehicle (AV) in the first computerized simulation, wherein the first response comprises at least one of a first static temporal clearance parameter, a first dynamic temporal clearance parameter, and a first traffic compliance parameter, the first input being the AI driver;
determine a first safety quotient based on the first response;
determine a second response from a second computerized simulation based on a second input controlling a second ego vehicle object that represents an AV in the second computerized simulation, wherein the second response comprises at least one of a second static temporal clearance parameter, a second dynamic temporal clearance parameter, and a second traffic compliance parameter;
determine a second safety quotient based on the second response;
determine a comparison parameter by comparing the first safety quotient determined based on the first computerized simulation and the second safety quotient determined based on the second computerized simulation, wherein the comparison parameter indicates which one of the first input and the second input is a superior input; and
train the AI driver using the comparison parameter.

* * * * *